United States Patent [19]

Nusser

[11] Patent Number: 4,740,686
[45] Date of Patent: Apr. 26, 1988

[54] OPTICAL SENSOR CIRCUITRY

[75] Inventor: Heinz Nusser, Brookfield Center, Conn.

[73] Assignee: The Perkin-Elmer Corporation, Norwalk, Conn.

[21] Appl. No.: 905,716

[22] Filed: Sep. 9, 1986

[51] Int. Cl.⁴ .......................................... H01J 40/14
[52] U.S. Cl. ............................................... 250/214 R
[58] Field of Search ................... 250/205, 214 R, 551

[56] References Cited

U.S. PATENT DOCUMENTS

| | | | |
|---|---|---|---|
| 3,770,966 | 11/1973 | Sagawa et al. | 250/205 |
| 3,956,628 | 5/1976 | Hanger | 250/205 |
| 4,074,143 | 2/1978 | Rokos | 250/205 X |
| 4,097,731 | 6/1978 | Krause et al. | 250/205 |
| 4,203,032 | 5/1980 | Haunstetter et al. | 250/205 |
| 4,247,765 | 1/1981 | Bergström | 250/205 X |
| 4,247,790 | 1/1981 | Sahasrabudhe et al. | 250/551 X |
| 4,270,045 | 5/1981 | Werking | 250/205 |
| 4,281,325 | 7/1981 | Jarva | 250/205 X |
| 4,300,211 | 11/1981 | Hudson | 250/205 X |
| 4,352,013 | 9/1982 | Fasig et al. | 250/205 X |
| 4,376,277 | 3/1983 | Black, Jr. | 250/205 X |
| 4,521,681 | 6/1985 | Inaba et al. | 250/205 |
| 4,577,096 | 3/1986 | Beery et al. | 250/205 |
| 4,580,044 | 4/1986 | Hongo et al. | 250/205 |
| 4,605,848 | 8/1986 | Ogawa | 250/205 |
| 4,643,571 | 2/1987 | Ferber et al. | 250/205 X |
| 4,652,742 | 4/1987 | Wauer et al. | 250/205 X |

*Primary Examiner*—Thomas H. Tarcza
*Assistant Examiner*—Mack Hellner
*Attorney, Agent, or Firm*—Thomas P. Murphy; Edwin T. Grimes; Francis L. Masselle

[57] ABSTRACT

A photo sensor circuit including an LED (12) and a phototransistor (14) coupled together by resistors ($R_1$, $R_2$) and connected to a drive and sense network (16) including resistors ($R_B$, $R_3$, $R_4$), a source of positive voltage (+Vcc) and a PNP transistor (20) by a single conductor wire ($W_1$). When the light path between the LED (12) and the phototransistor (14) is blocked, the circuit standby current is low and the transistor (20) is OFF, but when the light blockage is removed, the increase in current through the LED (12), triggered by an increase in current through the phototransistor (14) quickly drives the transistor (20) into saturation. The phototransistor (14) will keep full current flowing through the LED (12) as long as the light blockage is removed. This circuit enables selected resistances for appropriate standby current for one selected photo sensor network to be used with various networks of LEDs and phototransistors with varying component parameters and also reduces the current drain by one-third to one-fourth the current drain of conventional photo sensor circuitry.

4 Claims, 1 Drawing Sheet

OPTICAL SENSOR CIRCUITRY

BACKGROUND OF THE INVENTION

This invention relates, in general, to photo sensors (also called photo detectors) and is directed specifically to an improvement in drive and sensing circuitry for photo sensors.

This invention can best be understood by a reference to FIG. 1 of the drawings in which a schematic of a prior art photo sensor drive and sensing circuitry is disclosed.

In FIG. 1, it can be seen that the components of the photo sensor 10, ie, a light emitting diode (LED) 12 and a phototransistor 14 are connected by two conductor wires $W_1$ and $W_2$ in the conventional manner. One wire is connected between a positive voltage supply +Vcc and the LED and the other wire is connected between the phototransistor 14 and a sensing (driven or output) circuitry 16, shown as a PNP transistor 20 connected to a Schmitt trigger 22.

When a number of optical sensors of this prior art type are used, wiring and design becomes somewhat complex. Each optical sensor circuit requires different components since each circuit has to be tailored (adjusted) for each LED due to a wide spread in acceptable parameters for each LED. Also, since the current through each LED is a fixed value and each LED is biased fully ON in such prior art circuits with 15 to 20 milliamperes of current (15 to 20 milliamps × the number of LEDs used), there is considerable current being used. Also, this current is being used whether or not the phototransistor is detecting the presence (light blockage) or the absence (no light blockage) of an object between it and the LED.

It is an object of this invention to reduce the wiring complexity where a number of optical sensors are used and to eliminate the need for selecting different components, ie, to eliminate the need to tailor each circuit for each LED. That is to say that when the same brand photosensor-LED unit is used in a number of places in an electrical mechanical device, it is not necessary to use different bias resistors for each circuit. In accordance with this invention all circuits will have the same LED bias network designed for the worst case.

Still another object of this invention is to reduce the current through each photo sensor circuit in stand-by mode thus reducing the overall current required when a number of photo sensors are used.

Still another object of this invention is to simplify the circuitry and to increase the reliability of photo sensors, mainly because of the reduced LED current in stand-by mode.

SUMMARY OF THE INVENTION

The invention which meets the foregoing objects comprises a photo sensor network (a phototransistor, an LED and resistors) which is connected to both the drive circuitry (bias resistor and voltage source) and the sense back circuitry (PNP transistor and resistor network) connected to an output device (Schmitt trigger). The phototransistor and LED are coupled to each other and to the drive and sense back circuitry such that during light blockage between the LED and phototransistor, the standby current is low (the LED is not biased fully ON) and, upon removal of the light blockage the current through the LED increases by the increase in current through the phototransistor which quickly turns the PNP transistor fully ON. As long as the light blockage is removed, the phototransistor will keep the full current flowing in the LED. Since this circuitry drives the PNP transistor into saturation, the same resistance values are usable with various sensors.

DETAILED DESCRIPTION

Figure 1:
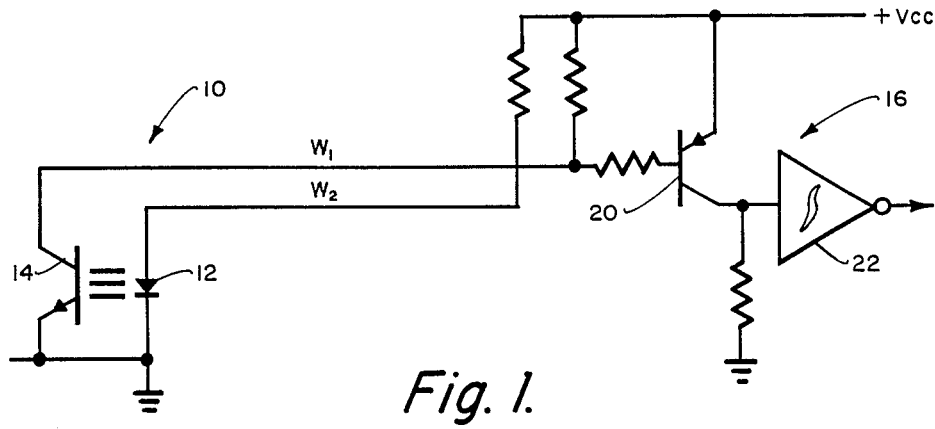
FIG. 1 is a schematic of the prior art photo sensor two conductor wire drive and sensing circuitry as described above in the Background of the Invention.
Figure 2:
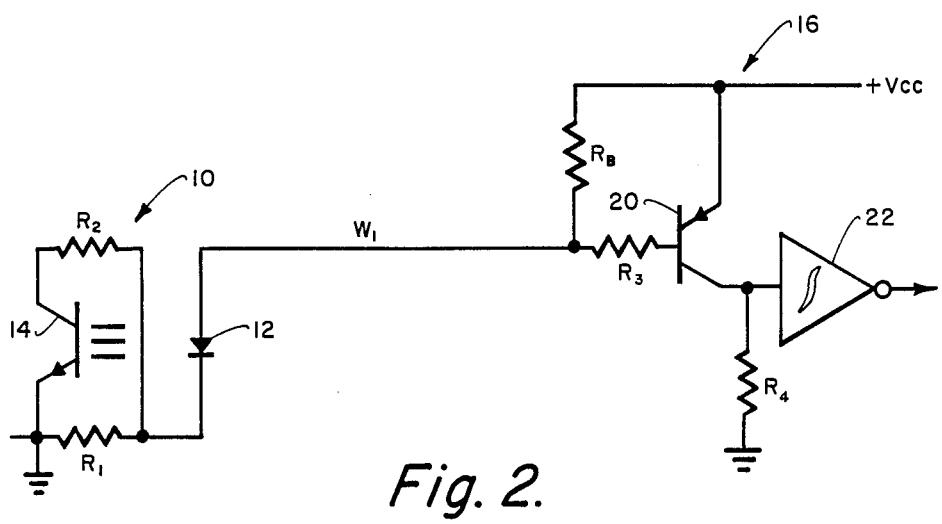
FIG. 2 is a schematic of the photo sensor utilizing the teachings of this invention wherein only one conductor wire is used both to drive the photo sensor and to sense back from it.

Since FIG. 1 was previously described, attention is now directed to FIG. 2 which illustrates schematically the photo sensor circuit 10 of this invention wherein the photo sensor network which can be described generally as comprising an LED 12, a phototransistor 14, coupled together by a pair of resistors, and connected by a single conductor wire $W_1$ to a source of positive voltage +Vcc and to a sensing and output circuitry 16.

More specifically, in the circuit, the cathode of the LED 12 is connected to negative ground through resistor $R_1$, and is connected to the collector of the phototransistor 14 through resistor $R_2$. The emitter of the phototransistor 14 is connected directly to ground and to resistor $R_1$ on the side opposite the connection of the cathode of the LED 12 to resistor $R_1$. Thus, the LED 12 is connected to resistors $R_1$ and $R_2$ in parallel (when the phototransistor is conducting) and the phototransistor 14 is connected in series with resistor $R_2$ and the LED 12. Of course, the phototransistor 14, in practice, is positioned to be activated by the light emitted from the LED 12. Also the photosensor LED unit is preferably a sensor with a darlington transistor such as a GE photon coupled interrupter module H22B3.

The anode of the LED 12 is connected by the single conductor wire $W_1$ to a source of positive voltage +Vcc through resistor $R_B$ and is also connected to the base of a PNP transistor 20 through resistor $R_3$. The emitter of the PNP transistor 20 is also connected to the source of voltage +Vcc between +Vcc and the end of resistor $R_B$ opposite the latter's connection to resistor $R_3$.

The collector of the PNP transistor 20 is connected to an output device, in this case, a Schmitt trigger 22 as a pulse conditioner, and through a resistor $R_4$ to negative ground.

In the illustrated embodiment of the invention, with the light path from the LED 12 blocked off and the phototransistor 14 OFF, the stand-by current through the LED 12 is determined by:

$$I_{off} = \frac{V_{CC} - V_{Diode}}{R_1 + R_B}$$

Utilizing the above formula with the small base current $V_{BE}$ through resistor $R_3$ being ignored, the standby current can be determined to be approximately 5 milliamps. This current is enough to produce enough light to activate the phototransistor 14. The voltage drop across resistor $R_B$ is smaller than $V_{BEON}$, thus the voltage across resistor $R_4$ is approximately 0.0 volts.

The base of the PNP transistor 20 is high and thus the PNP transistor 20 is OFF.

When the light path blockage is removed, the phototransistor 14 will begin to conduct and also will begin to shunt resistor $R_1$ which will, in turn, by high light output increase the current through the phototransistor 14 and so on. At the moment the LED 12 begins to increase the current, the PNP transistor 20 starts toward an ON position and as the resistor $R_1$ is further shunted, the current at the base of the PNP transistor 20 avalanches rapidly until the PNP transistor 20 is fully ON. The voltage drop across the resistor $R_B$ ($I_{ON} \times R_B$) Volts (disregarding the much lower voltage drop across resistor $R_3$) so that the voltage at the base of the PNP transistor 20 is low in the PNP transistor is ON.

The current through the LED 12 is now:

$$I_{ON} = \frac{(V_{CC} - V_D)(R_1 + R_2) - V_{CES} R_1}{(R_1 + R_2) R_B + R_1 R_2}$$

and the OFF current as a function of the ON current is:

$$I_{off} = I_{ON} \frac{R_2 + R_1 // R_B}{R_1 \left(1 - \frac{V_{CES}}{V_{CC} - V_D}\right) + R_2}$$

and the voltage drop across resistor $R_B$ is:

$$V_{RB} = \frac{(V_{CC} - V_D)(R_1 + R_2) - V_{CES} R_1}{R_1 + R_2 + \frac{R_1 R_2}{R_B}} > V_{BEON} + I_B R_3$$

and the output voltage across $R_4$ is $V_{cc} - V_{ces}$.

As an example of a circuit in accordance with this invention—$R_1 = 750$ ohms, $R_2 = 150$ ohms, $R_3 = 4.7K$ ohms, $R_3 = 1K$ ohms, $R_B = 68$ ohms, LED/phototransistor 12/14 is a GE:H22B3 module, transistor 20 is a 2N4403, and the Schmitt trigger is a TI:74LS14

Utilizing the above formulas:

$$I_{OFF} = \frac{5 - 1.2}{750 + 68} = 4.6 \text{ mA}$$

$$I_{ON} = \frac{(5 - 1.2)(750 + 150) - 1.00^* \times 750}{(750 + 150)68 + 150 \times 750} = 15 \text{ mA}$$

*where 1.00 V is the $V_{CES}$ for module H22B3

It can be seen that there is a substantial savings in current per circuit in stand-by mode.

In summary, it is apparent from the foregoing that the main features of this circuit, among other advantages are:

1. Reduced complexity of wiring harness where multiplicity of devices are used, and
2. Low stand-by current extending the life expectency of the LEDs and less current drain from the power supply.

I claim:
1. A photo sensor circuit comprising,
   a photo sensor network,
   a drive and output network,
   both said networks being coupled only by a single conductor wire,
   said photo sensor network comprising an LED and a phototransistor positioned to be responsive to light from said LED,
   a first resistor connected to the cathode of said LED and to ground and to the emitter of said phototransistor,
   a second resistor connected to said first resistor and to the cathode of said LED and to the collector of said phototransistor,
   said drive and output network comprising a source of positive voltage and a transistor coupled thereto and to an output device,
   said source of positive voltage applying current to said LED and phototransistor and to said transistor,
   the current through said LED when the light from said LED is prevented from reaching said phototransistor being insufficient to drive said transistor to an ON state, but when said light is permitted to reach said phototransistor said transistor is driven to an ON state by the increased current through said LED,
   said increase in current sufficient to drive said transistor to an ON state being caused by a reduction in resistance value between said LED and said phototransistor.
2. The photo sensor circuit as claimed in claim 1 wherein said drive and output network further includes a third resistor $R_B$, a fourth resistor $R_3$, and a fifth resistor $R_4$,
   said third resistor being connected to said single conductor wire, to said fourth resistor and the source of positive voltage $+V_{cc}$,
   said fourth resistor also being connected to the base of said transistor, and
   said fifth resistor being connected to the collector of said transistor and to ground.
3. The photo sensor circuit as claimed in claim 2 wherein said output device comprises a pulse conditioning means and is connected to said fifth resistor and to said transistor.
4. The photo sensor circuit as claimed in claim 3 wherein the current through the circuit when light is prevented from reaching the phototransistor is:

$$I_{off} = \frac{V_{CC} - V_{Diode}}{R_1 + R_B}$$

and where the current through the circuit when the light is not prevented from reaching the phototransistor is:

$$I_{ON} = \frac{(V_{CC} - V_D)(R_1 + R_2) - V_{CES} R_1}{(R_1 + R_2) R_B + R_1 R_2}.$$

* * * * *